US011828821B2

(12) United States Patent
Schneider et al.

(10) Patent No.: US 11,828,821 B2
(45) Date of Patent: Nov. 28, 2023

(54) MAGNETIC RESONANCE TOMOGRAPHY HAVING DUAL RECORDING FOR NOISE REDUCTION

(71) Applicant: Siemens Healthcare GmbH, Erlangen (DE)

(72) Inventors: Rainer Schneider, Erlangen (DE); Stephan Biber, Erlangen (DE); David Grodzki, Erlangen (DE); Stephan Kannengießer, Wuppertal (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/544,172

(22) Filed: Dec. 7, 2021

(65) Prior Publication Data

US 2022/0187399 A1 Jun. 16, 2022

(30) Foreign Application Priority Data

Dec. 11, 2020 (EP) .................................... 20213423

(51) Int. Cl.
*G01R 33/48* (2006.01)
*G01R 33/385* (2006.01)
*G01R 33/56* (2006.01)

(52) U.S. Cl.
CPC ....... *G01R 33/4818* (2013.01); *G01R 33/385* (2013.01); *G01R 33/5608* (2013.01)

(58) Field of Classification Search
CPC .............. G01R 33/385; G01R 33/4818; G01R 33/5608
See application file for complete search history.

(56) References Cited

U.S. PATENT DOCUMENTS

2017/0108569 A1 4/2017 Harvey
2018/0143272 A1 5/2018 Liu
(Continued)

FOREIGN PATENT DOCUMENTS

EP 3470868 A1 4/2019
EP 3723037 A1 10/2020
WO 2019068687 A2 4/2019

OTHER PUBLICATIONS

Breuer, Felix A., et al. "Controlled aliasing in parallel imaging results in higher acceleration (CAIPIRINHA) for multi-slice imaging." Magnetic Resonance in Medicine: An Official Journal of the International Society for Magnetic Resonance in Medicine 53.3 (2005): 684-691.

*Primary Examiner* — Gregory H Curran
(74) *Attorney, Agent, or Firm* — Lempia Summerfield Katz LLC

(57) ABSTRACT

In accordance with a method for operating an MRT system a first MR recording is performed so as to map an object to generate first MR data that represents the object. The first MR recording is performed in accordance with a first k-space scanning scheme and during the first MR recording at least one first excitation pulse is transmitted. A second MR recording that is different from the first MR recording is performed to generate second MR data and a noise component is determined in dependence upon the second MR data by a computing unit and the noise component represents an influence of at least one external noise source. An MR image is generated by the computing unit in dependence upon the first MR data and in dependence upon the noise component.

20 Claims, 3 Drawing Sheets

(56) References Cited

U.S. PATENT DOCUMENTS

| | | | | |
|---|---|---|---|---|
| 2020/0241096 | A1* | 7/2020 | Bustin ................ | G01R 33/4818 |
| 2020/0249292 | A1 | 8/2020 | Biber | |
| 2020/0256941 | A1 | 8/2020 | Stehning et al. | |
| 2020/0327645 | A1 | 10/2020 | Takai et al. | |
| 2021/0103018 | A1 | 4/2021 | Biber et al. | |

* cited by examiner

MAGNETIC RESONANCE TOMOGRAPHY HAVING DUAL RECORDING FOR NOISE REDUCTION

CROSS REFERENCE TO RELATED APPLICATIONS

This application claims the benefit of EP20213423.5 filed on Dec. 11, 2020, which is hereby incorporated by reference in its entirety.

FIELD

Embodiments relate to a method for operating a magnetic resonance tomography system.

BACKGROUND

Systems for magnetic resonance tomography, MRT, are imaging apparatuses that, so as to map an examination object, orient nuclear spins of the examination object using an intense external magnetic field and excite the nuclear spins to precession around the corresponding orientation by way of a magnetic alternating field. The precession or the return of the spin from this excited state into a state having less energy in turn generates a magnetic alternating field as a response and the alternating field may be detected via receive antennas.

With the aid of magnetic gradient fields, it is possible to imprint a spatial encoding onto the signals, that subsequently renders it possible to allocate the signal that is received to a volume element of the examination object. The received signal may then be evaluated, for example to provide a three-dimensional imaging representation of the examination object. For example, local receive antennas, e.g., local coils, may be used as receive antennas and the receive antennas may be arranged directly on the examination object so as to achieve an improved signal to noise ratio, SNR. The receive antennas may however also be arranged in the vicinity of the examination object or for example may be integrated into a patient couch.

The magnetic resonance signals (MR signals) that are to be received for the imaging are extremely weak with the result that in the case of known MRT systems a shielding of external interference signals is required to achieve a sufficient SNR. For this purpose, complex shielding chambers are installed to reduce disruptive emissions. This leads to considerable costs and structural limitations on account of the corresponding requirement for space.

A magnetic resonance tomography unit including active noise suppression and a corresponding method are described in the document WO 2019/068687 A2. In this case, a first receive antenna is provided so as to receive a magnetic resonance signal from a patient and a second receive antenna is provided so as to receive a noise signal. A receiver that is connected to the receive antennas is configured for the purpose of suppressing the noise signal that is received using the second receive antenna in the magnetic resonance signal that is received by the first receive antenna. For this purpose, the noise signal is determined during the MRT sequences for the signal acquisition. Time periods may be used in which no MRT signal is expected for the imaging. An interference suppression controller may then combine the signals of the first receiving coil and the second receiving coil in a weighted manner to minimize the energy of the noise signal in the combined signal.

Since these periods are of different length and occur at different times depending on the MRT sequence that is used, the approach for suppressing interference must be adapted individually to each MRT sequence, that leads to an increased outlay. Moreover, it may be possible depending on the MRT sequence that the available periods are not sufficiently long enough to determine the interference signal to achieve a reliable suppression of the influence of the noise.

BRIEF SUMMARY AND DESCRIPTION

The scope of the present disclosure is defined solely by the appended claims and is not affected to any degree by the statements within this summary. The present embodiments may obviate one or more of the drawbacks or limitations in the related art.

Embodiments provide an MRT system and a method for operating an MRT system that reduces the outlay for a shielding of external noise signals and simultaneously provides a high degree of effectiveness of the noise reduction, for example with as little adaptation outlay as possible.

Embodiments perform two MR recordings that are different to one another to generate in each case MR data that likewise represents in part an object and in dependence upon the different MR data to determine a noise component that represents the influence of an external noise source.

A method for operating an MRT system is disclosed. A first MR recording is performed so as to map an object, for example of the MRT system to generate first MR data that represents the object. The first MR recording in this case is performed in accordance with a first k-space scanning scheme and while the first MR recording is performed, for example, by at least one transmit antenna of the MRT system, at least one first excitation pulse is transmitted in accordance with a first pulse sequence in the direction of the object. A second MR recording that is different from the first MR recording is performed, for example by the MRT system, to generate second MR data that is different from the first MR data. A noise component is determined in dependence upon the second MR data by a computing unit, for example a computing unit of the MRT system, and the noise component represents an influence of at least one external noise source, for example an influence of the at least one external noise source on the first MR data. An MR image is generated by the computing unit in dependence upon the first MR data and in dependence upon the noise component.

During the first MR recording, therefore the at least one excitation pulse is connected so that nuclear spins of the object precess about the orientation axis in accordance with the static magnetic field and the resonance of the nuclear spins leads to MR signals that may be detected by one or multiple receive antennas of the MRT system to generate the first MR data. The first MR data in this case is influenced by the at least one external noise source so that the noise component is provided in the first MR data.

In a similar manner, during the second MR recording second excitation pulses are connected to obtain corresponding MR signals and to generate the second MR data. In this case, the second MR recording is performed differently from the first MR recording. In another embodiment, during the second MR recording, the excitation pulse is not connected so that only the influence of the external noise source is represented by the second MR data.

Neither the first MR recording nor the second MR recording necessarily represent a complete MR recording with the result that the first MR data and the second MR data do not necessarily suffice alone to generate the MR image, for example a position space image. For example, during the first and/or the second MR recording not necessarily the complete k-space region that is to be scanned for the imaging is scanned. On the contrary, further first MR recordings and/or further second MR recordings are performed to realize a complete scan for the required imaging. It is however also possible that a complete scan is already realized by the first MR recording.

A pulse sequence is in this case and below for example characterized by one or multiple time parameters, for example an echo time TE and/or a repetition time TR. Where applicable, further parameters may contribute to the definition of a pulse sequence.

The term a "k-space scanning scheme" in this case and below may be understood to mean a scheme that contains the points or regions that are scanned in the k-space and the sequence in which this occurs. A k-space scanning scheme may be for example a Cartesian k-space scanning scheme, a radial k-space scanning scheme, a spiral k-space scanning scheme and so on.

Apart from the influence of the at least one external noise source, the noise component may also contain an influence of thermal noise.

The MR image that is generated in dependence upon the first MR data and the noise component corresponds for example to an interference suppressed k-space image or a position space image.

The noise component may be determined for example in dependence upon the second MR data and independently of the first MR data, for example if during the second MR recording an excitation pulse is not connected. Alternatively, the noise component may be generated or determined in dependence upon both the first MR data as well as the second MR data, for example if during the second MR recording excitation pulses are connected.

The second MR recording differs from the first MR recording and as such the second MR recording parameters are used that differ from corresponding parameters for the first MR recording. For example, the second MR recording may be performed in accordance with a second k-space scanning scheme that is different from the first k-space scanning scheme and/or at least one second excitation pulse may be transmitted in the direction of the object in accordance with a second pulse sequence during the second MR recording. The second pulse sequence differs from the first pulse sequence and/or the at least one second excitation pulse differs from the at least one first excitation pulse. In some embodiments, it is possible to also completely omit the transmission of excitation pulses during the second MR recording.

The at least one external noise source is for example at least one essentially static noise source. This may be understood to mean that the influence of the at least one external noise source is not changed or is essentially not changed from the first MR recording to the second MR recording. For example, static noise source does not necessarily mean that the effect of the static noise source is permanently unchanged. The closer the first and the second MR recording are to one another, the less noticeable is a temporal change of the influence or the effect of the at least one external noise source.

Therefore, different MR data, e.g., the first MR data and the second MR data, is generated in different MR recordings. Since the effect of the external noise sources however does not essentially change, the influence of the at least one noise source on the first MR data is approximately identical to the influence of the external noise source on the second MR data. Depending on the embodiment of the second MR recording, it is therefore possible to determine the noise component for example owing to correlation of the first MR data with the second MR data or based on the second MR data alone. The noise component that is determined in this manner may then be removed at least in part from the first and/or the second MR data to generate the MR image and thus to compensate the influence of the at least one external noise source. The removal or reduction of the noise component in this case may be performed in the position space or in the k-space or in a hybrid space. The removal of the noise component or the reduction of the noise component may however also in part be performed in the k-space and in part in the position space and so on.

Because the noise component is determined in situ for the prevailing specific current noise environment, a particularly effective suppression of the influence of the external noise sources is possible. For example, it is not necessary to utilize specific time periods during the MR recordings, for example during the first MR recording, during which an MR signal is not expected. Embodiments may therefore be applied universally for the most diverse first k-space scanning schemes and/or first pulse sequences.

The use of shielding chambers may be omitted for shielding from external noise influences or the shielding chambers may be configured in a simpler manner, for example that may save installation space and/or costs. A further advantage is that it is also not necessary to use any additional receive antennas with which the noise component could be detected in a dedicated manner. It is also possible as a consequence to further save installation space and costs.

In an embodiment, the second MR recording is performed in accordance with a second k-space scanning scheme that differs from the first k-space scanning scheme.

For example, during the second MR recording, for example by the at least one transmit antenna, at least one second excitation pulse is transmitted in accordance with a second pulse sequence in the direction of the object. The second MR data set then likewise represents the object. In this case, the second pulse sequence may be identical to the first pulse sequence or different from the first pulse sequence.

Since the second k-space scanning scheme differs from the first k-space scanning scheme, the first MR data also differs from the second MR data. The influence of the external noise source is however approximately identical on the first MR data and on the second MR data. Because the k-space scanning schemes differ, the influence of the noise source is however not significant, it is possible by correlation of the first MR data and the second MR data with one another to determine the influences of the external noise source in the form of the noise component. For example, the noise component in such embodiments is determined in dependence upon the first MR data and the second MR data.

Embodiments include the advantage that also the second MR data may be used so as to generate the MR image with the result that additional time that is spent for the second MR recording may be utilized in a yet more efficient manner.

In an embodiment, the first and the second pulse sequence differ from one another. For example, the first pulse sequence is defined by a first-time parameter set and the second pulse sequence is defined by a second time parameter set that differs from the first-time parameter set.

The first-time parameter set contains for example a first echo time and/or a first repetition time. The second pulse sequence accordingly contains a second echo time and a second repetition time. The first and the second echo time differ in this case from one another and/or the first and the second repetition time differ from one another.

For example, a first ratio of the first echo time to the first repetition time may differ from a second ratio of the second echo time to the second repetition time. Consequently, it is possible in each case to realize different contrasts for the first and second MR recording. As a consequence, the MR signal components of the first and the second MR data correlate even less with one another with the result that the noise component may be even better extracted, for example by correlation of the first MR data with the second MR data.

In an embodiment, for example an embodiment in which the at least one second excitation pulse is transmitted in accordance with the second pulse sequence, the MR image is generated in dependence upon the first MR data and in dependence upon the second MR data.

As a consequence, it is possible to achieve a higher degree of accuracy of the resulting MR image and simultaneously to reduce the influence of the external noise source.

In an embodiment, in dependence upon the first MR data and the second MR data a signal separation algorithm is implemented by the computing unit to determine the noise component.

The signal separation algorithm may contain for example an algorithm for principal component analysis, PCA or an algorithm for independent component analysis, ICA.

In an embodiment, the second MR recording is performed in accordance with the first k-space scanning scheme, therefore for example not in accordance with the second k-space scanning scheme. During the second MR recording, for example by the at least one transmit antenna, an excitation pulse is not transmitted in the direction of the object.

The MR image is generated for example independently of the second MR data. The second MR data in this case does not represent the object. The second MR recording is used in such embodiments only so as to detect the noise component.

Embodiments include the advantage that the noise component may be determined independently of the first MR data. Since during the second recording an excitation pulse is not transmitted, accordingly an MR signal is also not to be expected by the object with the result that the second MR data particularly precisely reproduces the noise component.

In an embodiment, for example an embodiment in which the second MR recording is performed in accordance with the first k-space scanning scheme, a first part region of the k-space is recorded during a first period of the first MR recording and the first part region of the k-space is recorded during a first period of the second MR recording that follows the first period of the first MR recording. A second part region of the k-space is recorded during a second period of the first MR recording that follows the first period of the second MR recording.

For example, the second part region of the k-space may be recorded during a second period of the second MR recording that follows the second period of the first MR recording.

Different part regions of the k-space may be recorded alternately in accordance with the first and the second MR recording. In each case the same k-space scanning scheme is followed however excitation pulses are only transmitted during the periods of the first MR recording, not during the periods of the second MR recording. For example, the k-space may be recorded alternately line by line with and without excitation pulses.

As a consequence, it is possible to achieve that during consecutive periods of the first and the second MR recording less time elapses with the result that the effect of the at least one external noise source changes to an even lesser extent with the result that it is more suitable to adopt a static noise source.

In an embodiment, by the computing unit a raw image is generated based on the first MR data set and a noise image is generated based on the second MR data set. By the computing unit, a difference is generated between the raw image and the noise image, and the MR image is generated in dependence upon the difference.

In this case, the raw image and/or noise image may be provided in each case in the k-space, in the position space or a hybrid space. The raw image is generated for example independently of the second MR data and the noise image is generated independently of the first MR data. In each case, the raw image contains the noise component in addition to the information that represents the object. The noise image only contains the noise component but does not contain any information relating to MR signals of the object.

The noise image directly provides the noise component. A simple compensation of the external noise influences is therefore possible.

In an embodiment, the first k-space scanning scheme corresponds to a Cartesian scanning scheme or a radial scanning scheme or a spiral scanning scheme or a wave CAIPIRINHA scanning scheme, wherein CAIPIRINHA stands for “Controlled Aliasing in Parallel Imaging Results in Higher Acceleration”.

Fundamentally, the same scanning scheme is possible for the second k-space scanning scheme as for the first k-space scanning scheme.

In an embodiment, the first k-space scanning scheme corresponds to a Cartesian scanning scheme and the second k-space scanning scheme corresponds to a radial scanning scheme or a spiral scanning scheme or a wave CAIPIRINHA scanning scheme.

In an embodiment, an MRT system is provided that includes a scanner unit that is configured so as to perform a first MR recording so as to map an object in accordance with a first k-space scanning scheme to generate first MR data that represents the object. During the first MR recording, for example by one or multiple transmit antennas of the MRT system, at least one first excitation pulse is transmitted in accordance with a first pulse sequence in the direction of the object. The scanner unit is configured so as to perform a second MR recording that is different from the first MR recording to generate second MR data. The MRT system includes a computing unit that is configured to determine in dependence upon the second MR data a noise component that represents an influence of at least one external noise source and to generate an MR image in dependence upon the first MR data and the noise component.

The scanner unit may contain for example a magnet unit. The magnet unit may contain a field magnet for generating a static magnetic field and also one or multiple gradient coils for generating time-dependent magnetic field gradients, for example in the direction of the three different spatial directions. The scanner unit contains for example a radiofrequency unit for generating the at least one excitation pulse by the at least one transmit antenna. The at least one transmit antenna may be part of the scanner unit. A control unit of the scanner unit may control or supply the mentioned components accordingly to perform the MR recordings as described.

Further embodiments of the MRT system follow directly from the different embodiments of the method and vice versa. For example, an MRT system according to the improved concept is configured so as to perform a method as described herein.

Embodiments provide a computer program including commands. In the case of execution of the commands or the computer program by an MRT system, the commands prompt the MRT system to perform a method as described herein.

Embodiments provide a computer readable storage medium that stores the computer program.

The computer program and also the computer readable storage medium may be referred to in each case as computer program products including the commands.

The features and feature combinations that are mentioned above in the description and also the features and feature combinations that are mentioned below in the description of the figures and/or in the figures alone may not only be used in the respectively disclosed combination but rather also may be used in other combinations without departing from the scope of the invention. There are also embodiments and feature combinations that are to be regarded as disclosed that do not have all the features of an originally worded independent claim and/or that go beyond or deviate from the feature combinations that are set out in the back references of the claims.

DETAILED DESCRIPTION

Figure 1:
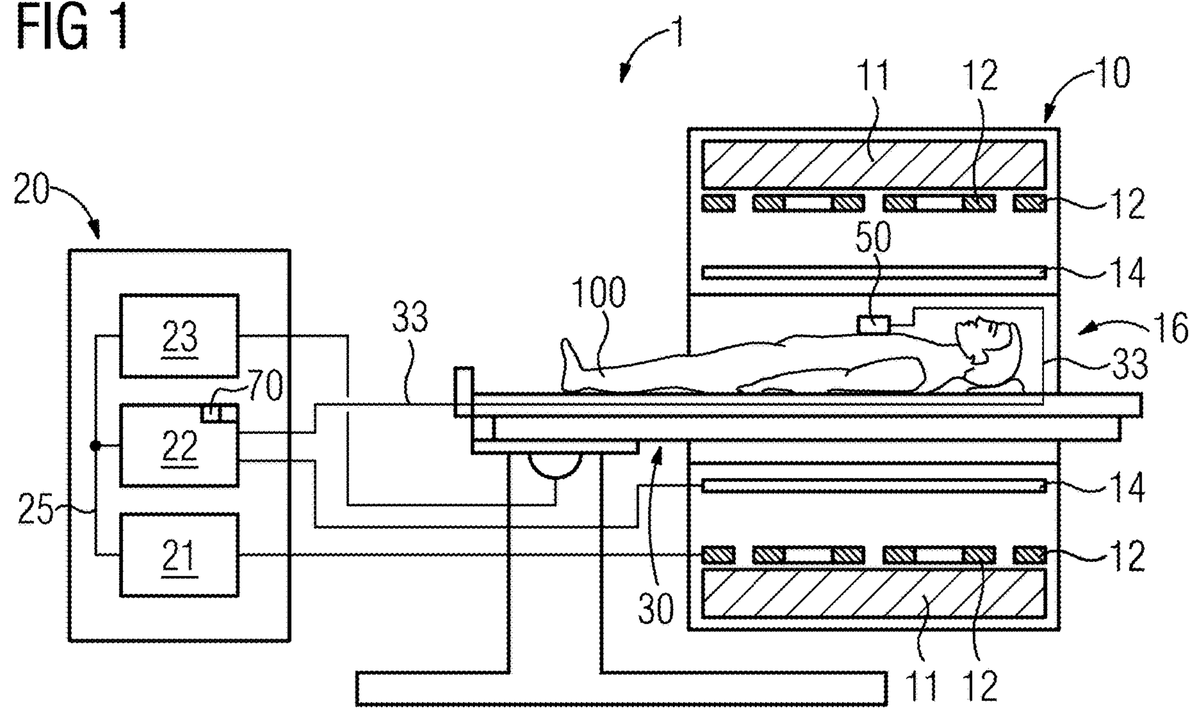
FIG. 1 depicts a schematic representation of an MRT system according to an embodiment.

FIG. 1 depicts a schematic representation of an embodiment of an MRT system 1.

The MRT system 1 includes a magnet unit 10 including a field magnet 11 that generates a static magnetic field so as to orient nuclear spins of a sample, for example a patient 100, in an examination region or receiving region. The patient 100 may be located in this case for example on a patient couch 30. The receiving region is characterized by an extremely homogenous static magnetic field. The homogeneity for example relates to the magnetic field strength or its value. The receiving region is for example approximately spherical and is positioned in a patient tunnel 16 that extends in a longitudinal direction 2 through the magnet unit 10. The field magnet 11 may be for example a superconductive magnet that may provide magnetic fields including a magnetic flux density of up to 3 T or more. For lower field strengths, it is however possible to also use permanent magnets or electromagnets including normally conductive coils.

Furthermore, the magnet unit 10 includes gradient coils 12 that are configured so as to, with regard to the spatial differentiation of the detected mapping regions in the receiving region, to superimpose position-dependent magnetic fields onto the static magnetic field in the three spatial directions. The gradient coils 12 may be configured for example as coils of normally conductive wires and the coils may generate for example fields or field gradients that are orthogonal with respect to one another in the receiving region.

The magnet unit 10 may include for example a body coil 14 as a transmit antenna and the body coil is configured so as to emit a radiofrequency signal into the examination region and the radiofrequency signal is supplied via a signal line. The body coil 14 may also be used in some embodiments to receive resonance signals that are emitted by the patient 100 and to output the resonance signals via a signal line.

The MRT system 1 includes a control unit 20 that may supply the magnet unit 10 with different signals for the gradient coils 12 and the body coil 14 and may evaluate the signals that are received. The control unit 20 may have for example a gradient controller 21 that is configured so as to supply the gradient coils 12 via supply lines with variable currents that in a temporally coordinated manner may provide the desired gradient fields in the examination region.

The control unit 20 may also have a radiofrequency unit 22 that is configured so as to generate radiofrequency pulses or excitation pulses including predetermined temporal curves, amplitudes and spectral power distribution so as to excite a magnetic resonance of the nuclear spin in the patient 100. In this case, pulse powers may be set in the kilowatt range. The excitation pulses may be emitted via the body coil 14 or via one or multiple local transmit antennas into the patient 100. The control unit 20 may also contain a controller 23 that may communicate via a signal bus 25 with the gradient controller 21 and the radiofrequency unit 22.

A local coil 50 may be arranged in the immediate vicinity of the patient 100, for example on the patient 100 or in the patient couch 30, and the local coil may be connected via a connecting line 33 to the radiofrequency unit 22. Depending on the embodiment, the local coil 50 alternatively or in addition may be used as a receive antenna for the body coil 14.

The receive antennas 14, 50 are for example in a signal connection with a computing unit 70 that is for example part of a receiver of the control unit 20. The computing unit 70 may contain for example a programmable logic unit, for example a field programmable gate array, FPGA, or a digital signal processor, DSP.

The function of the MRT system 1 is more precisely explained below with reference to embodiments of a method for operating an MRT system, for example with reference to the figures FIG. 2 to FIG. 4.

Figure 2:
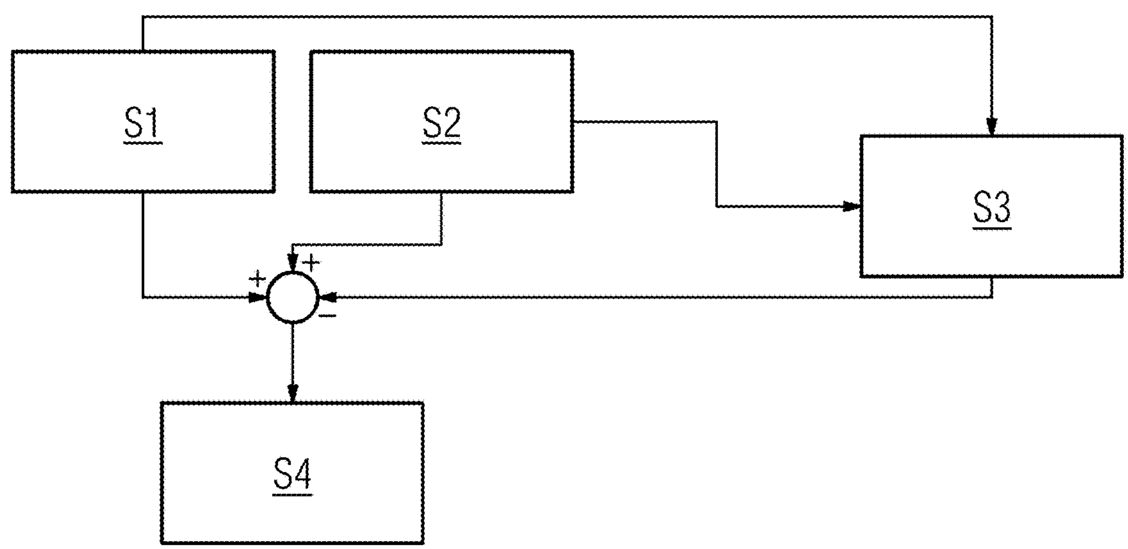
FIG. 2 depicts a sequence diagram of a method according to an embodiment.

FIG. 2 illustrates a schematic sequence diagram of an embodiment of a method.

In step S1, a first MR recording is performed by the MRT system 1 so as to map the patient 100. First MR data is generated by the first MR recording. The first MR recording in this case is performed in accordance with a first k-space scanning scheme. To illustrate the patient 100 by the first MR data, during the first MR recording excitation pulses are emitted in accordance with a first pulse sequence, for example by the body coil 14.

In step S2, a second MR recording that is different from the first MR recording is performed by the MRT system 1 to generate second MR data. In step S3, a noise component is determined by the computing unit 70 and the noise component represents an influence of at least one external noise source (not illustrated). The noise component in this case is determined in dependence upon the second MR data and in different embodiments additionally independence upon the first MR data. In step S4, the computing unit 70 generates an MR image in dependence upon the first MR data and the noise component, and in different embodiments also in dependence upon the second MR data.

In various embodiments, the first MR recording may be performed for example in accordance with a first coding using a Cartesian k-space scan. The second MR recording may be performed without emitting excitation pulses, in other words without an MR signal being emitted from the patient 100 and furthermore may be identical to the first MR recording. For example, the k-space scanning scheme is then identical to the first k-space scanning scheme during the second MR recording.

To better take into consideration external noise sources, it may be advantageous to perform the first and the second MR recording directly one after the other. For example, it is possible for corresponding periods of the first MR recording and the second MR recording to be recorded directly one after the other for the same k-space line with the result that likewise within the doubled repetition time the quasi-stationary adoption is justified for the external noise source.

In such embodiments, a pure noise image results from the second MR recording, therefore from the second MR data, and the pure noise image in the simplest case may be subtracted directly from the first MR data, that represents the raw image, while adopting the quasi-stationary approximation. The MR image in such embodiments is generated in step S4 alone based on the first MR data that is freed from the noise component.

In certain embodiments, however, the second MR recording is likewise used to represent the patient 100 to consequently improve the final MR image quality and to more efficiently utilize the doubled measuring time. In this case, during the second MR recording, for example in accordance with a second pulse sequence, at least one second excitation pulse is transmitted. The second MR recording is performed in accordance with a second k-space scanning scheme that differs from the first k-space scanning scheme.

The less correlated the two coding strategies for the first and the second MR recording are with respect to one another, the more intensely the resulting MR signals differ. For example, combinations including wave CAIPIRINHA codings are feasible that may contribute in the final image reconstruction to an improved image quality.

In certain embodiments, both the first MR data as well as the second MR data have contributions of MR signals from the patient 100. The noise component correlates between the first and the second MR data and may be extracted by suitable signal separation algorithms, for example PCA algorithms or ICA algorithms. In this case, for example all the local coil channels from the two coding strategies may be analyzed together to determine the common noise component from the uncorrelated MR signal codings. The noise component may be accordingly removed both from the first MR data as well as from the second MR data.

Since both the first as well as the second MR data now contain MR signal components, both may be connected in a common reconstruction process to generate the MR image. As a consequence, the entire image quality or the signal to noise ratio may be improved. Moreover, variations of the external noise sources may be yet further suppressed between the individual recordings.

For example, the final MR image may be suppressed by $X=X_1+\alpha*X_2$, where $X_1$ and $X_2$ correspond to the reconstructed position space images that are based on the first or second MR data and that are varied to minimize a cost function K. $\alpha$ represents a constant weighting factor. The cost function K may be provided for example by:

$$K=K(X_1,X_2)=|S_1-T_1(X_1)|+\alpha*|S_2-T_2(X_2)|+\alpha'*|X_1-X_2|.$$

In this case, $S_1$ and $S_2$ stand for the first or second MR data that are adjusted with the aid of the signal separation algorithm and $T_1$ or $T_2$ stands for the respective inverse reconstruction core that in the simplest case may be provided by a Fourier transformation. $\alpha'$ represents a further weighting factor in order, when applicable, to more intensely suppress differences between the two codings.

Figure 3:
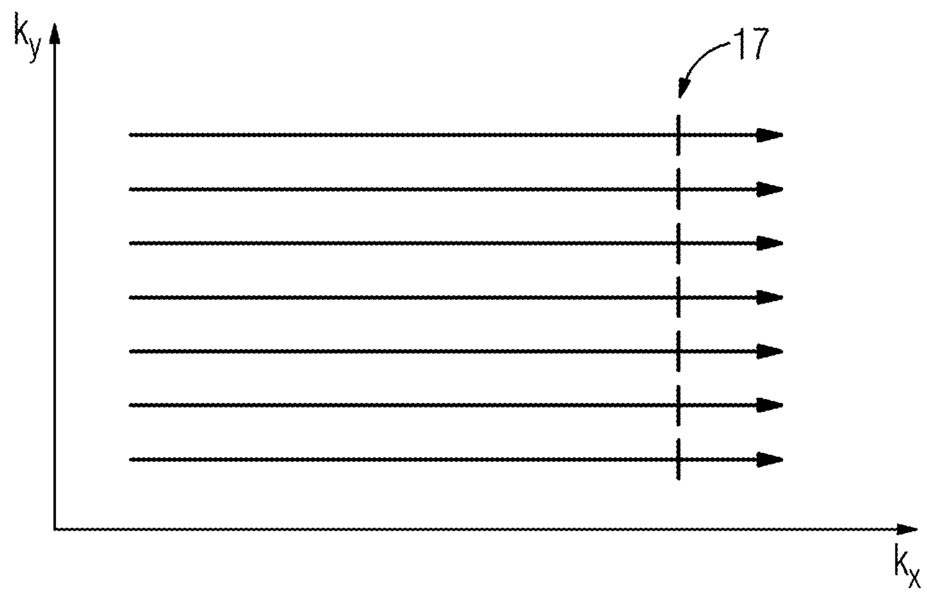
FIG. 3 depicts schematic k-space representations of influences of an external noise site according to an embodiment.
Figure 3:
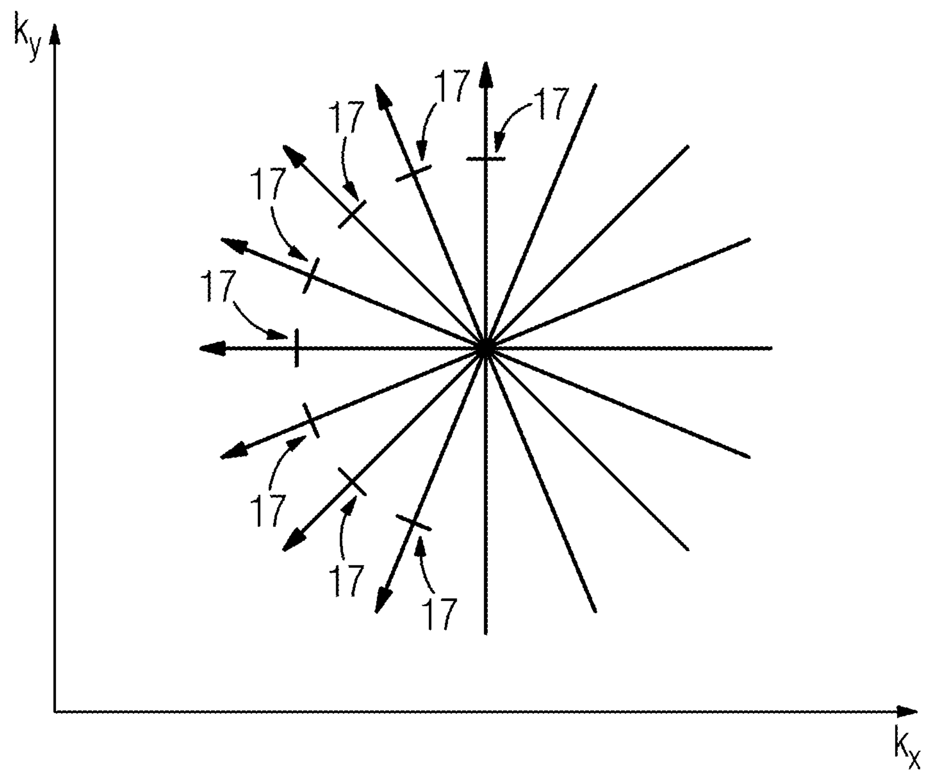

In FIG. 3, the influence 17 of the external noise sources is illustrated schematically in the k-space for different coding strategies. The mapping on the left-hand side in FIG. 3 corresponds for example to a Cartesian k-space scan. For example, an external noise source is adopted with an approximately monofrequent emission characteristic. The influence 17 is now noticeable in each k-space line at the same position. In the right-hand side mapping of FIG. 3, a radial k-space scanning scheme is juxtaposed with the mapping on the left-hand side. The influences 17 of the external noise sources are visible owing to different coding strategies at different positions in the k-space.

Figure 4:
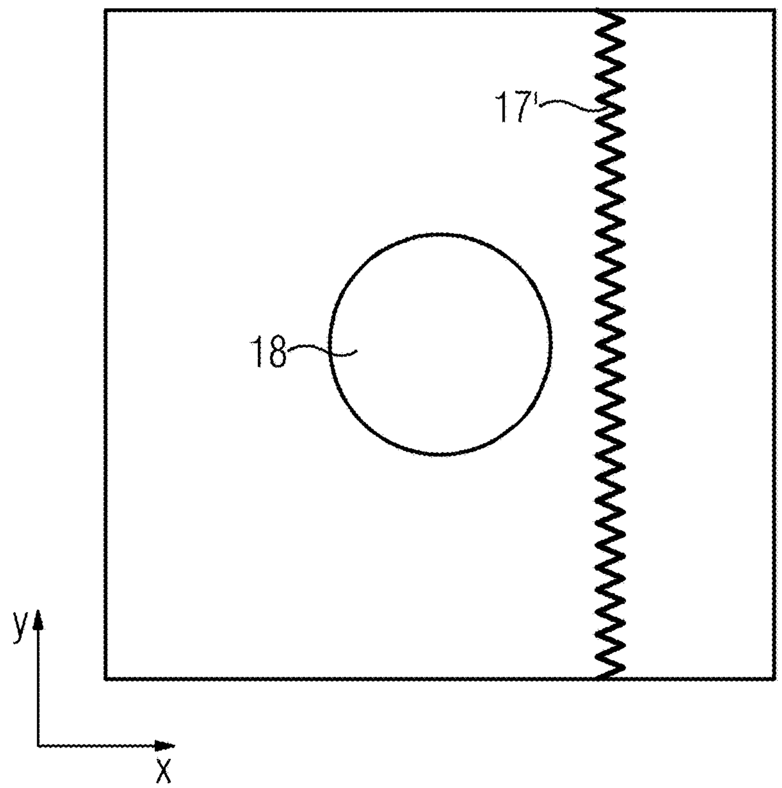
FIG. 4 depicts schematic position space representations of influences of an external noise site according to an embodiment.
Figure 4:
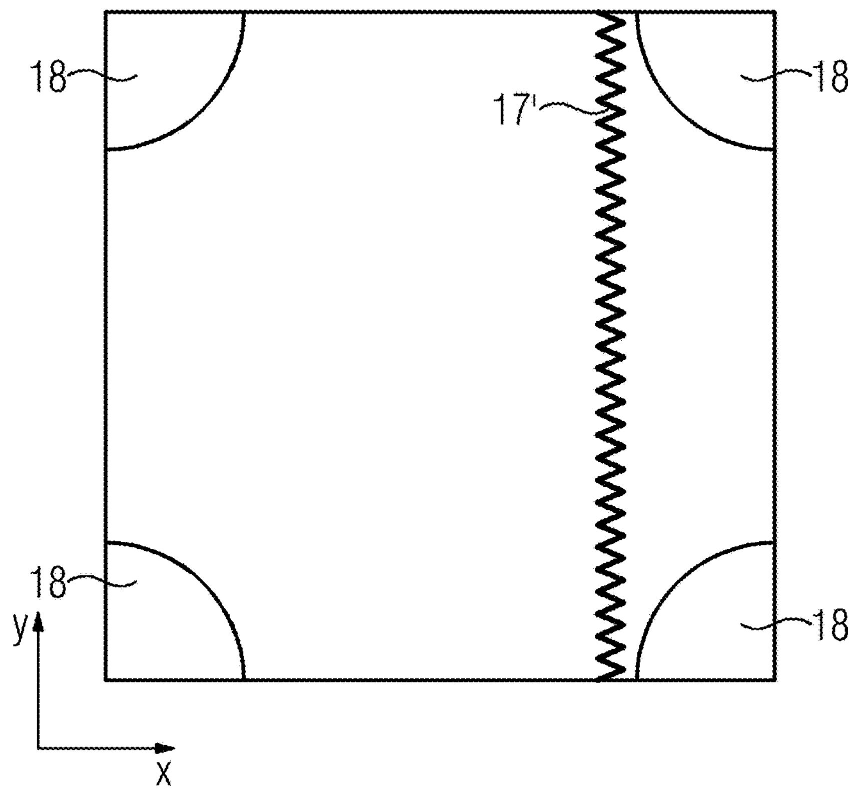

In FIG. 4, a simplified illustration of influences 17' of a further external noise source is illustrated for different coding strategies in the position space. In the left-hand side mapping of FIG. 4, a first coding strategy is used, on the right-hand side a second coding strategy is used in which the MR signals obtain an additional frequency and phase displacement that however does not experience the influences 17' of the external noise source. An object 18 that is accordingly mapped in the two MR recordings is therefore illustrated in the two position space representations. The influences IT of the external noise sources are however fundamentally identical in the two position space images.

As is explained in relation to FIG. 3 and FIG. 4, the improved concept renders it possible to separate the correlating noise influences from the non-correlating MR signals.

As described, for example in relation to the figures, a possibility for the reduction of noise during the operation of an MRT system is therefore provided by the improved concept and the requirements for shielding apparatuses may be reduced and a more reliable and effective suppression of noise influences is rendered.

Since MRT systems described in embodiments herein manage without shielding chambers or with less complex shielding chambers, it is possible to considerably reduce the costs of the installation and for example the reconfiguration of a device at another location since the installation depends significantly less on the building in which the device is installed.

The local coils in the patient tunnel are decoupled from the environment with approximately 20 to 50 dB since the patient tunnel acts as a cut off hollow conductor, at least in the case of systems including a static magnetic field of up to 3 T, and the propagation of a wave from the entrance into the patient tunnel to the local coil is therefore already suppressed. The effectiveness of the suppression increases with decreasing frequency at the same diameter of the patient tunnel. However, the patient, whose tissue is slightly conductive, acts as a monopole antenna that protrudes out of the patient tunnel and therefore forms a coaxial structure together with shell structures. It is consequently possible for noise to be collected and guided to the local coil. Similar effects may be caused by the coil cabling that protrudes from the patient tunnel. It is possible owing to the improved concept to compensate or to weaken such effects.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for operating a magnetic resonance (MR) tomography system, the method comprising:
- performing a first MR recording to map an object and to generate first MR data that represents the object, wherein the first MR recording is performed in accordance with a first k-space scanning scheme and during the first MR recording at least one first excitation pulse is transmitted in accordance with a first pulse sequence in a direction of the object;
- performing a second MR recording that is different from the first MR recording to generate second MR data that represents the object;
- determining a noise component based on the second MR data, wherein the noise component represents an influence of at least one external noise source; and
- generating an MR image based on the first MR data and the noise component.

2. The method of claim 1, wherein the second MR recording is performed in accordance with a second k-space scanning scheme that differs from the first k-space scanning scheme.

3. The method of claim 2, wherein at least one second excitation pulse is transmitted in accordance with a second pulse sequence in the direction of the object during the second MR recording, wherein the second pulse sequence differs from the first pulse sequence.

4. The method of claim 3, wherein the first pulse sequence is defined by a first-time parameter set and the second pulse sequence is defined by a second time parameter set that differs from the first-time parameter set.

5. The method of claim 3, wherein the MR image is generated further based on the second MR data.

6. The method of claim 3, wherein a signal separation algorithm is used to determine the noise component based on the first MR data and the second MR data.

7. The method of claim 6, wherein the signal separation algorithm contains an algorithm for principal component analysis or for independent component analysis.

8. The method of claim 1, wherein the second MR recording is performed in accordance with the first k-space scanning scheme and during the second MR recording an excitation pulse is not transmitted in the direction of the object.

9. The method of claim 8, wherein a first part region of a k-space is recorded during a first period of the first MR recording, the first part region of the k-space is recorded during a first period of the second MR recording that follows the first period of the first MR recording, and a second part region of the k-space is recorded during a second period of the first MR recording that follows the first period of the second MR recording.

10. The method of claim 9, wherein the second part region of the k-space is recorded during a second period of the second MR recording that follows the second period of the first MR recording.

11. The method of claim 8, further comprising:
- generating a raw image based on the first MR data set and a noise image based on the second MR data set; and
- determining a difference between the raw image and the noise image; wherein the MR image is generated based on the difference.

12. The method of claim 1, wherein a first k-space scanning scheme corresponds to a Cartesian scanning scheme or a radial scanning scheme or a spiral scanning scheme or a wave CAIPIRINHA scanning scheme.

13. The method of claim 2, wherein a first k-space scanning scheme corresponds to a Cartesian scanning scheme; and a second k-space scanning scheme corresponds to a radial scanning scheme or a spiral scanning scheme or a wave CAIPIRINHA scanning scheme.

14. A magnetic resonance tomography system comprising:
- a scanner unit configured to:
  - perform a first MR recording so as to map an object in accordance with a first k-space scanning scheme to generate first MR data that represents the object, wherein during the first MR recording at least one first excitation pulse is transmitted in accordance with a first pulse sequence in a direction of the object; and
  - perform a second MR recording that is different from the first MR recording to generate second MR data that represents the object; and
- a computing unit configured to
  - determine in dependence upon the second MR data a noise component that represents an influence of at least one external noise source; and
  - generate an MR image in dependence upon the first MR data and the noise component.

15. The magnetic resonance tomography system of claim 14, wherein the second MR recording is performed by the scanner unit in accordance with a second k-space scanning scheme that differs from the first k-space scanning scheme.

16. The magnetic resonance tomography system of claim 15, wherein at least one second excitation pulse is transmitted by the scanner unit in accordance with a second pulse sequence in the direction of the object during the second MR recording, wherein the second pulse sequence differs from the first pulse sequence.

17. The magnetic resonance tomography system of claim 16, wherein the first pulse sequence is defined by a first-time parameter set and the second pulse sequence is defined by a second time parameter set that differs from the first-time parameter set.

18. The magnetic resonance tomography system of claim 16, wherein the MR image is generated by the computing unit further based on the second MR data.

19. The magnetic resonance tomography system of claim 16, wherein a signal separation algorithm is used by the computing unit to determine the noise component based on the first MR data and the second MR data.

20. A non-transitory computer implemented storage medium that stores machine-readable instructions executable by at least one processor, the machine-readable instructions comprising:

performing a first MR recording to map an object and to generate first MR data that represents the object, wherein the first MR recording is performed in accordance with a first k-space scanning scheme and during the first MR recording at least one first excitation pulse is transmitted in accordance with a first pulse sequence in a direction of the object;

performing a second MR recording that is different from the first MR recording to generate second MR data that represents the object;

determining a noise component based on the second MR data, wherein the noise component represents an influence of at least one external noise source; and generating an MR image based on the first MR data and the noise component.

* * * * *